(12) United States Patent
Low et al.

(10) Patent No.: US 7,544,541 B2
(45) Date of Patent: Jun. 9, 2009

(54) SEMICONDUCTOR PACKAGE

(75) Inventors: Andrew Wye Choong Low, Menglembu Perak (MY); Mee Sing Tiong, Ipoh Perak (MY)

(73) Assignee: Unisem (M) Berhad, Perak (MY)

( * ) Notice: Subject to any disclaimer, the term of this patent is extended or adjusted under 35 U.S.C. 154(b) by 666 days.

(21) Appl. No.: 10/896,041

(22) Filed: Jul. 22, 2004

(65) Prior Publication Data
US 2005/0062172 A1    Mar. 24, 2005

(30) Foreign Application Priority Data
Sep. 23, 2003    (MY) .............................. PI 2003 3619

(51) Int. Cl.
*H01L 21/00* (2006.01)
(52) U.S. Cl. ...................... 438/113; 438/112
(58) Field of Classification Search ................. 438/111, 438/112, 113, 123, 124
See application file for complete search history.

(56) References Cited

U.S. PATENT DOCUMENTS

| | | | |
|---|---|---|---|
| 5,900,676 A * | 5/1999 | Kweon et al. ............... | 257/787 |
| 6,700,188 B2 * | 3/2004 | Lin ............................. | 257/684 |
| 6,773,961 B1 * | 8/2004 | Lee et al. .................... | 438/112 |
| 6,946,324 B1 * | 9/2005 | McLellan et al. ........... | 438/111 |
| 7,087,462 B1 * | 8/2006 | Park et al. ................... | 438/112 |
| 7,125,747 B2 * | 10/2006 | Lee et al. .................... | 438/112 |
| 2001/0008305 A1 * | 7/2001 | McLellan et al. ........... | 257/692 |

* cited by examiner

*Primary Examiner*—S. V. Clark
(74) *Attorney, Agent, or Firm*—Jacobson Holman PLLC

(57) ABSTRACT

There is disclosed a method of making an electronic package (10) by: forming a metal base (50) on which to build the components of an electronic package; applying a mask layer (60) on the base to an area that is not to be occupied by interconnection pads (200) or die attachment pads (201) of the package; plating layers of metal on the un-masked areas of the base to form the interconnection and die attachment pads (200,201); removing the mask layer; mounting a semiconductor die (302) to at least one die attachment pad (201); electrically connecting the semiconductor die (302) to one or more interconnection pads (200); embedding the components on the base in an encapsulation material (300) to form a package; removing the metal base (50) to leave a package panel; and cutting the panel into discrete package units.

12 Claims, 13 Drawing Sheets

Figure 1: Prior Art QFN Package Construction
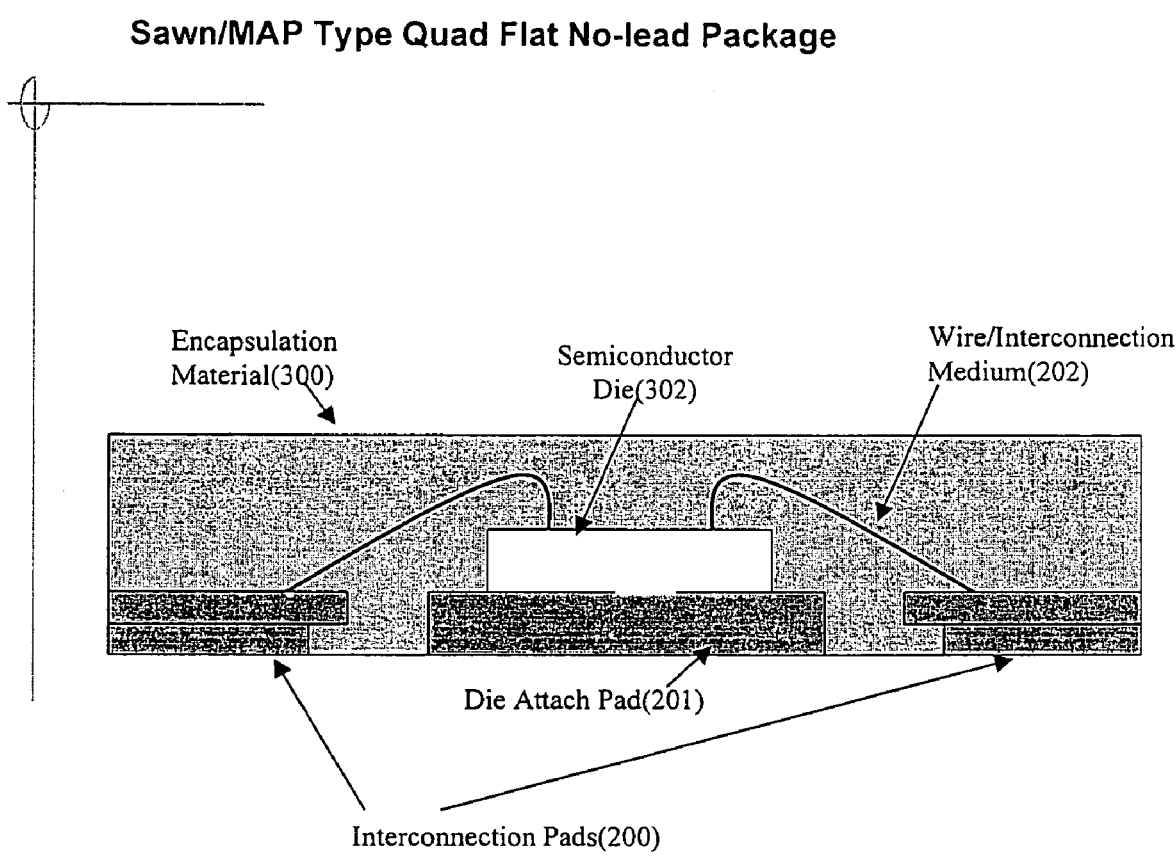

Figure 2: Prior Art QFN Package Process Flow
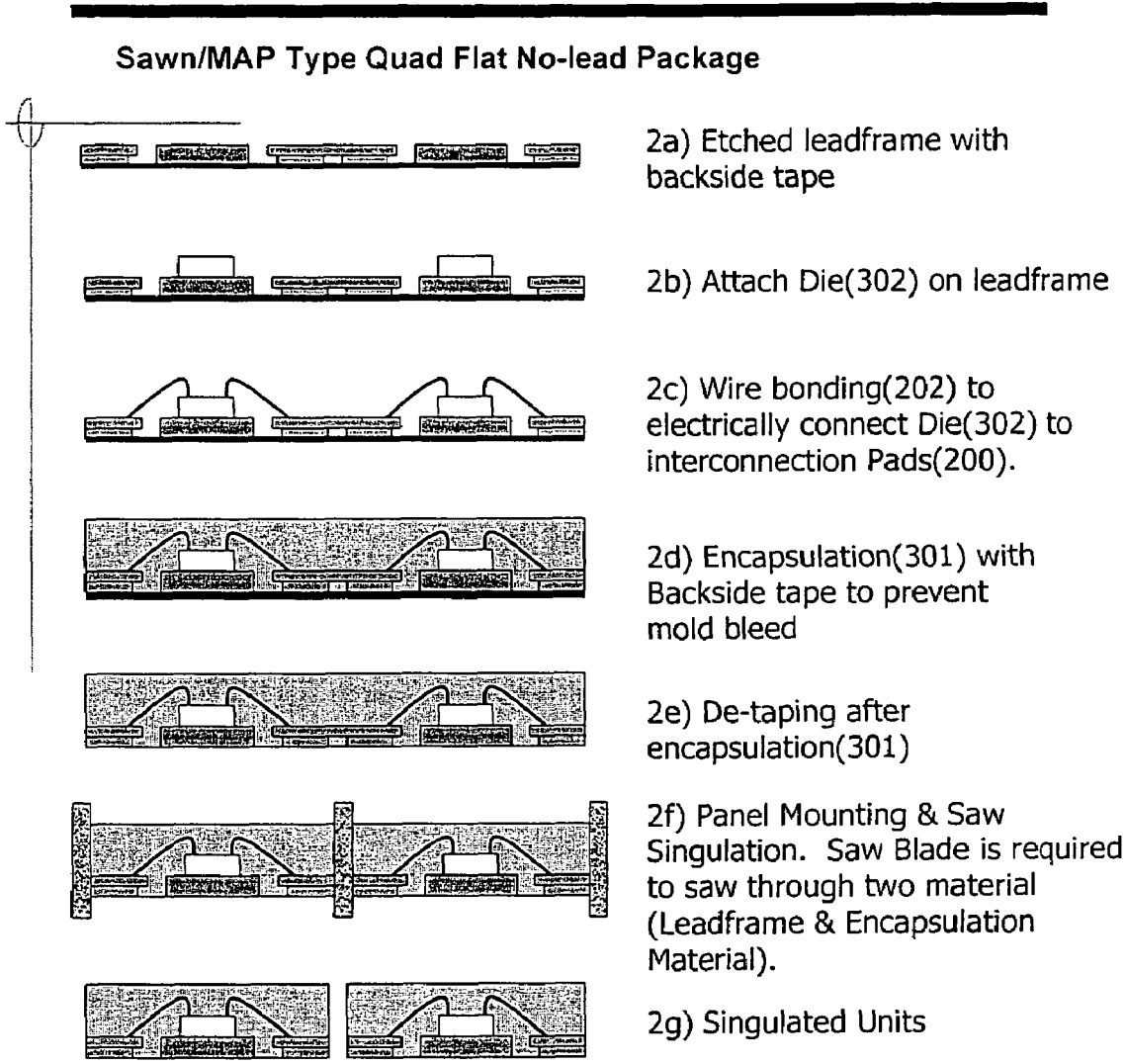

Figure 3 : UTSLP Package Construction

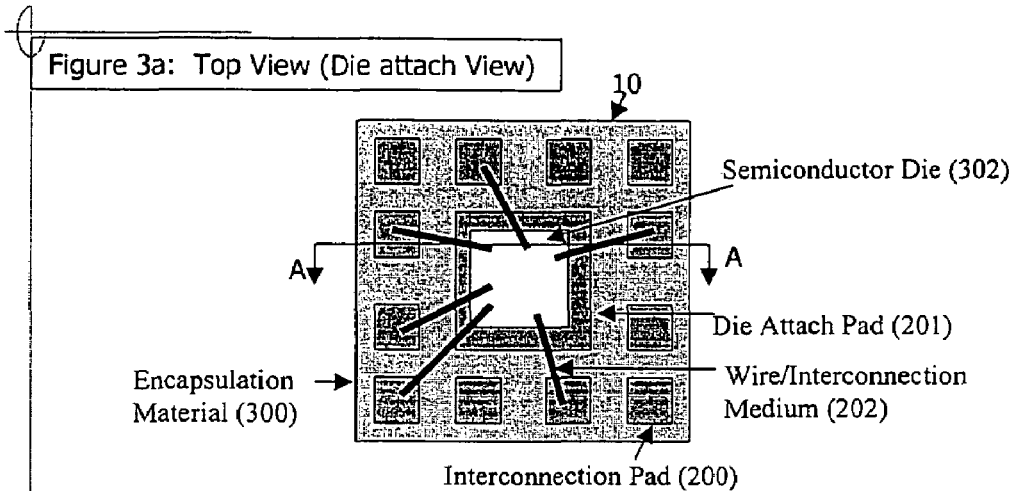

Figure 3a: Top View (Die attach View)

- Semiconductor Die (302)
- Die Attach Pad (201)
- Wire/Interconnection Medium (202)
- Interconnection Pad (200)
- Encapsulation Material (300)

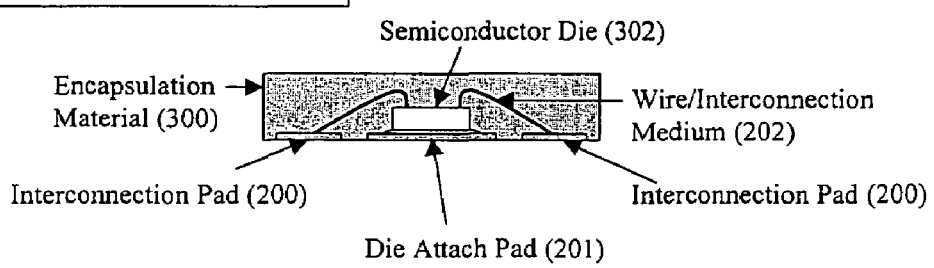

Figure 3b: Cross-section A-A

- Semiconductor Die (302)
- Encapsulation Material (300)
- Wire/Interconnection Medium (202)
- Interconnection Pad (200)
- Die Attach Pad (201)

Figure 3c: Interconnection Pads Arrangement

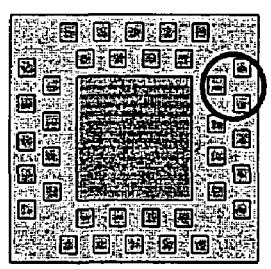
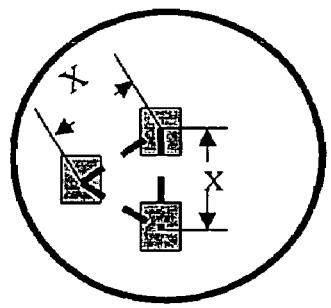

Interconnection Pad Pitch

Figure 4 : Plating Construction

| Plating Construction Options | | | |
|---|---|---|---|
| Option 1<br>Au (54)<br>Ni (53)<br>Au (51)<br>Cu (50) | Option 2<br>Ag (54)<br>Cu Strike<br>Ni (53)<br>Au (51)<br>Cu (50) | Option 3<br>Ag (54)<br>Cu (53)<br>Pd (52)<br>Au Strike (51)<br>Cu (50) | Option 4<br>Au (54)<br>Ni (52)<br>Cu (53)<br>Pd (52)<br>Au Strike (51)<br>Cu (50) |
| Option 5<br>Au (54)<br>Pd (52)<br>Ni (52)<br>Cu (53)<br>Pd (52)<br>Au Strike (51)<br>Cu (50) | Option 6<br>Ag (54)<br>Cu Strike<br>Ni (53)<br>Pd (51)<br>Au Strike<br>Cu (50) | Option 7<br>Au (54)<br>Ni (52)<br>Cu (53)<br>Ni (52)<br>Pd (52)<br>Au Strike (51)<br>Cu (50) | Option 8<br>Au (54)<br>Pd (52)<br>Ni (52)<br>Cu (53)<br>Ni (52)<br>Pd (52)<br>Au Strike (51)<br>Cu (50) |

Figure 5 : "Mushroom" Interconnection Pads & Die Attach Pad Locking Feature
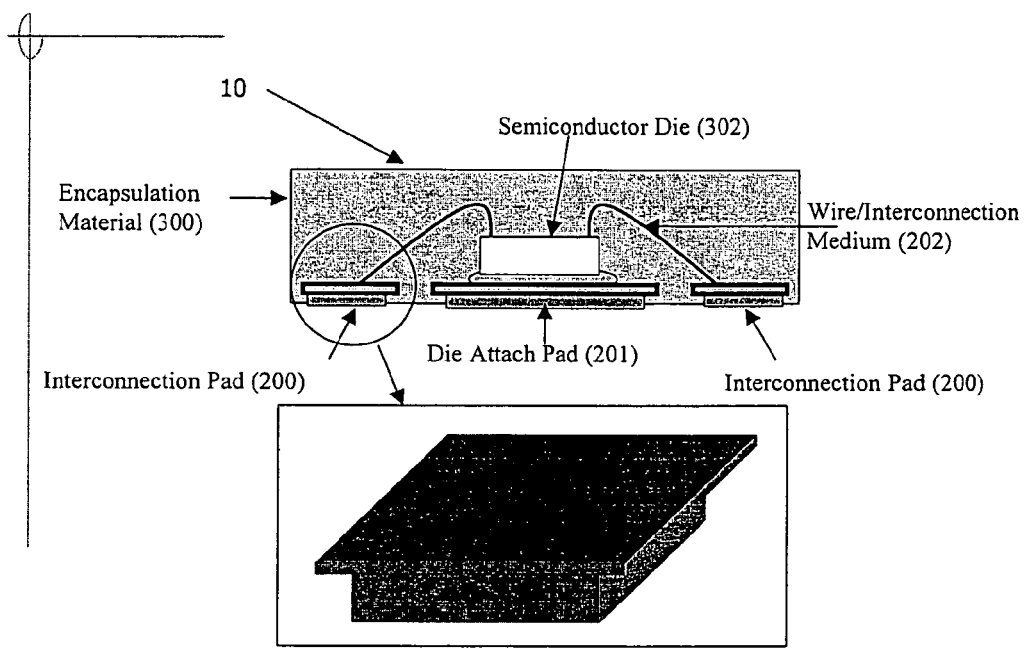

Figure 6 : Solder Finish Option for UTSLP
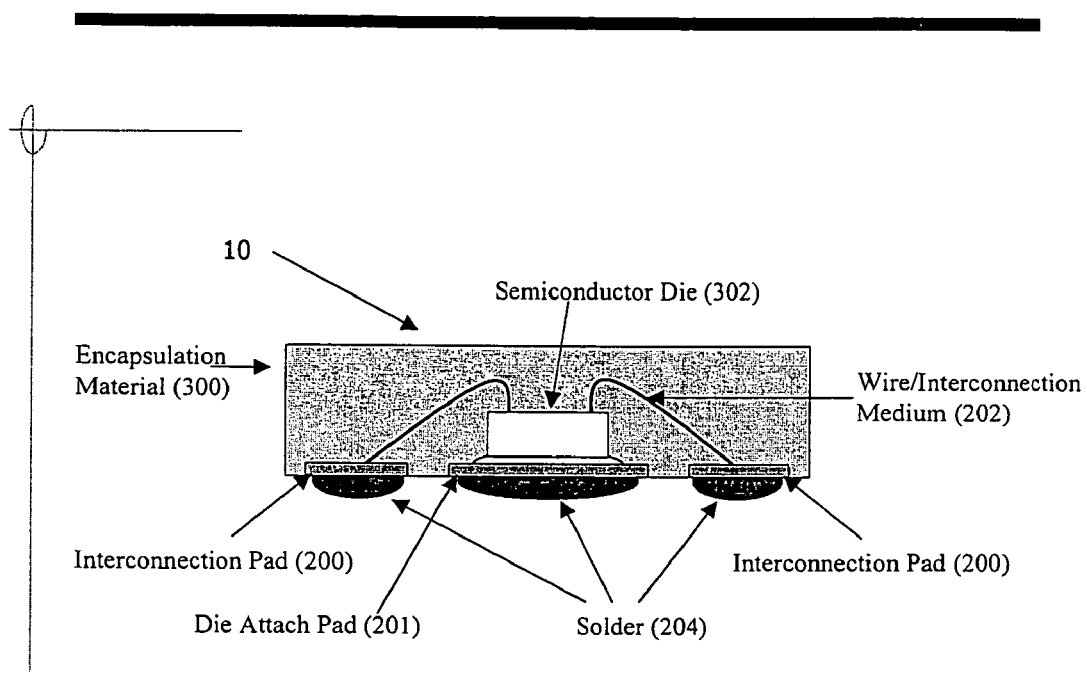

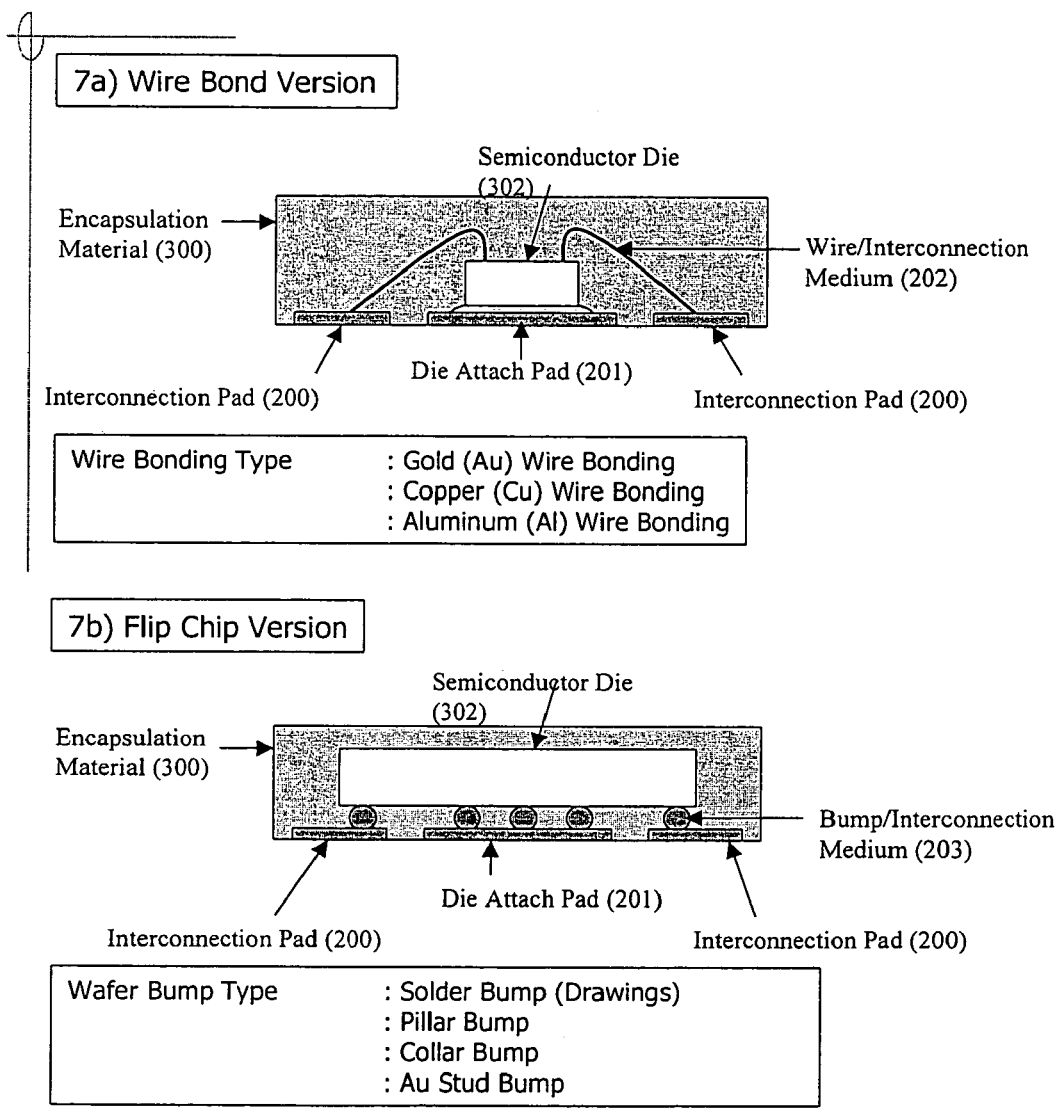
Figure 7 : Wire Bond and Flip Chip Option for UTSLP

Figure 8 : Stand-off Option for UTSLP
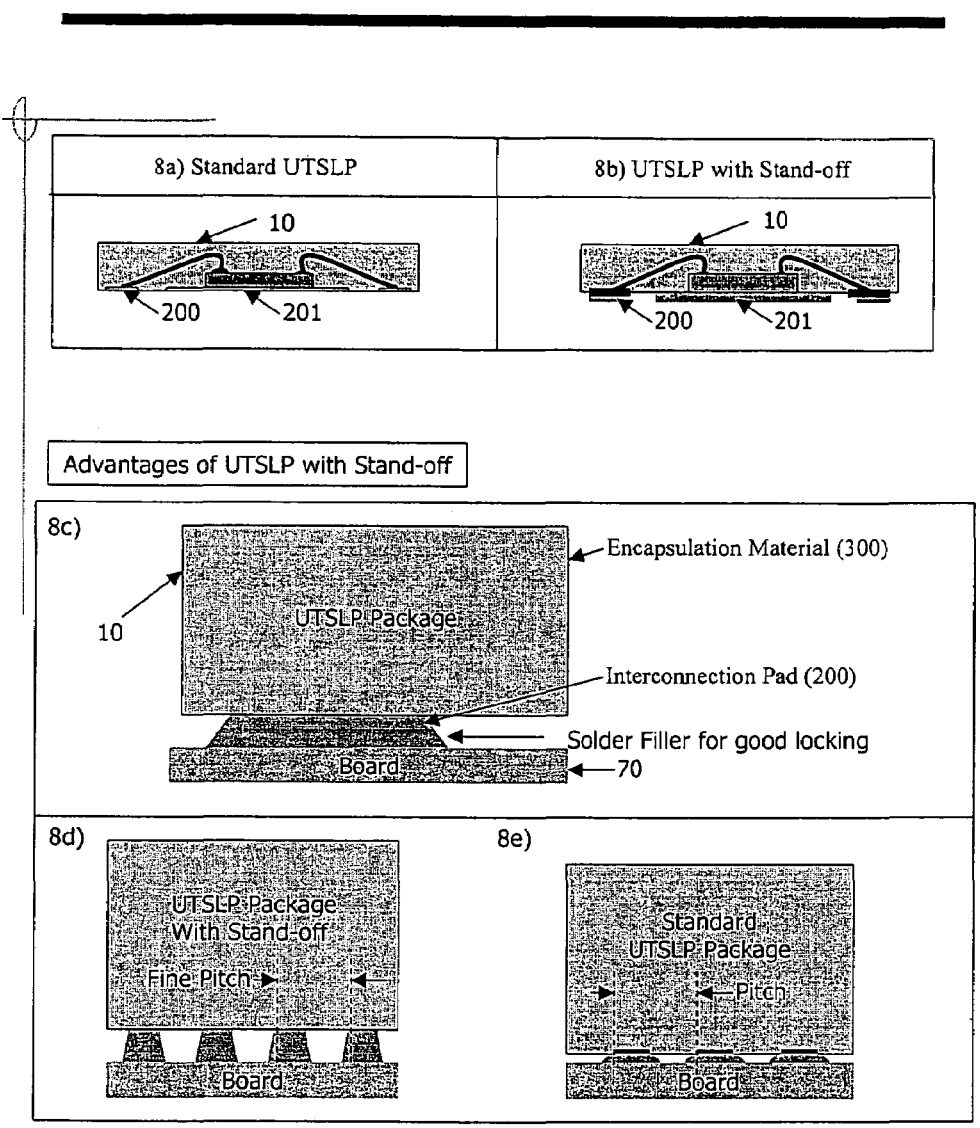

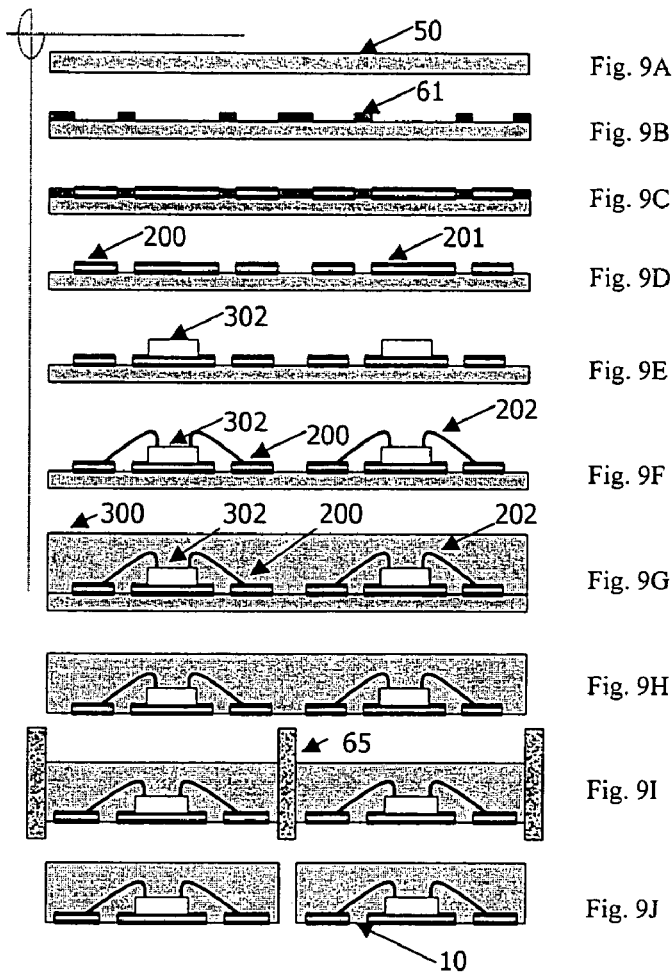
Figure 9 : Ultra Thin Small Leadless Package Process Flow

Figure 10 : Ultra Thin Small Leadless Package Process Flow
UTSLP-Wire Bond Version with Stand-off
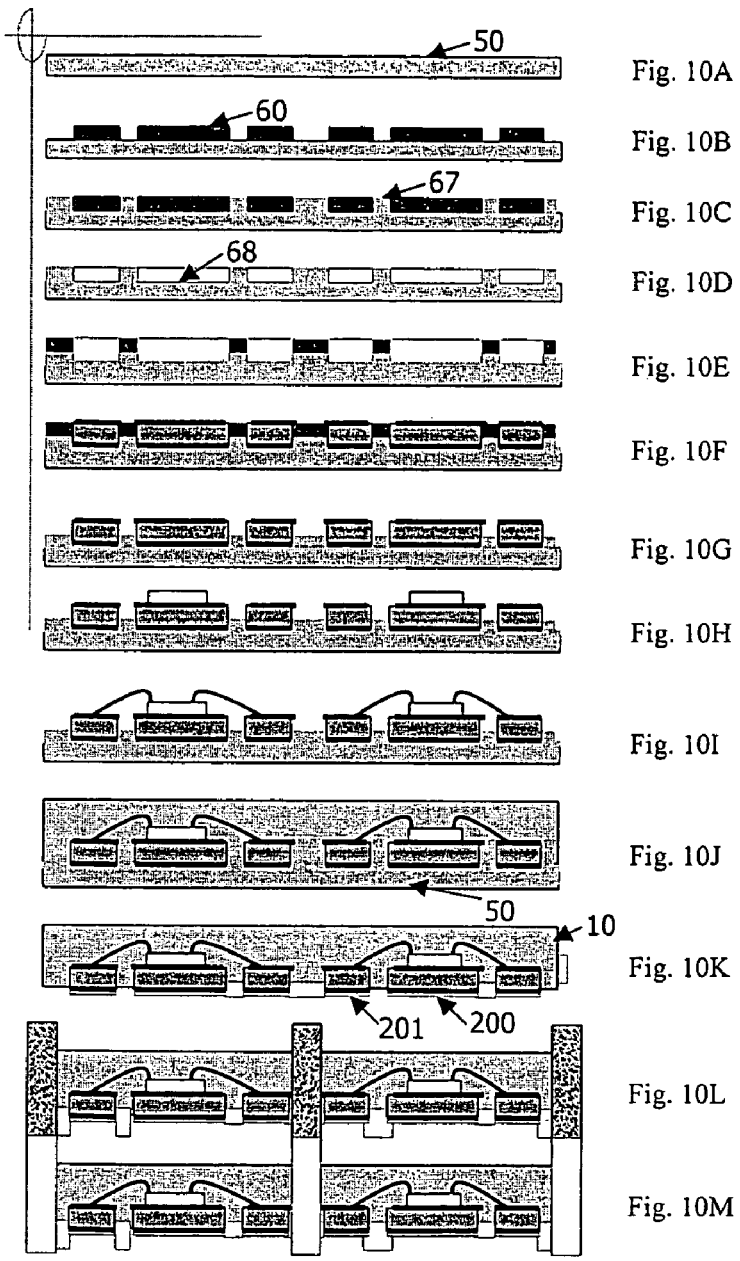

Figure 11 : Ultra Thin Small Leadless Package Process Flow
Standard UTSLP-Flip Chip Version
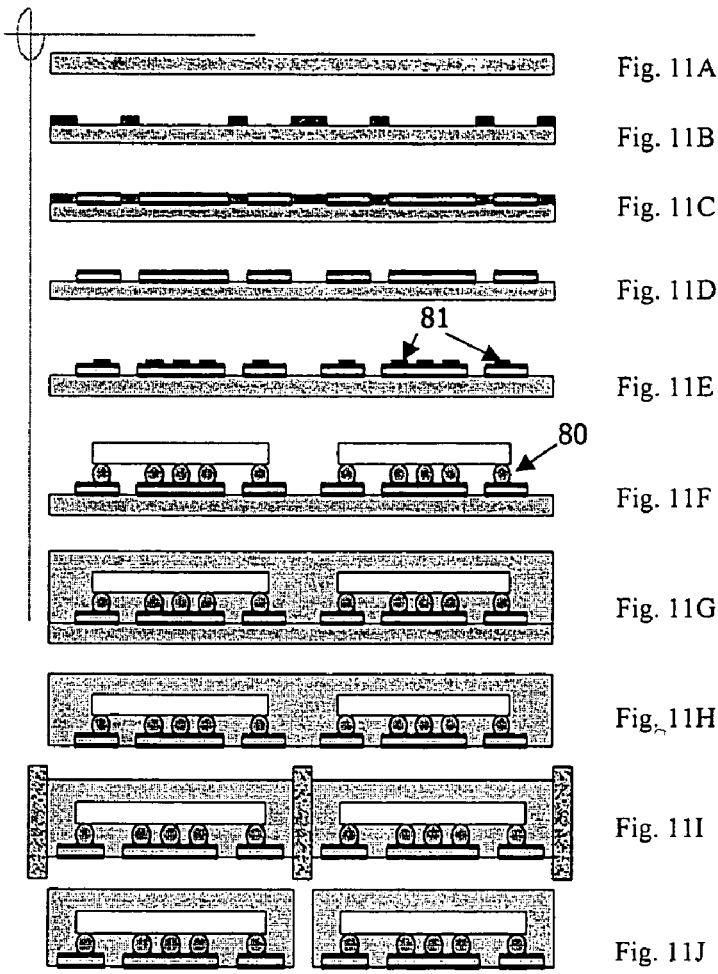

Figure 12 : Ultra Thin Small Leadless Package Process Flow
UTSLP-Flip Chip Version with Stand-off
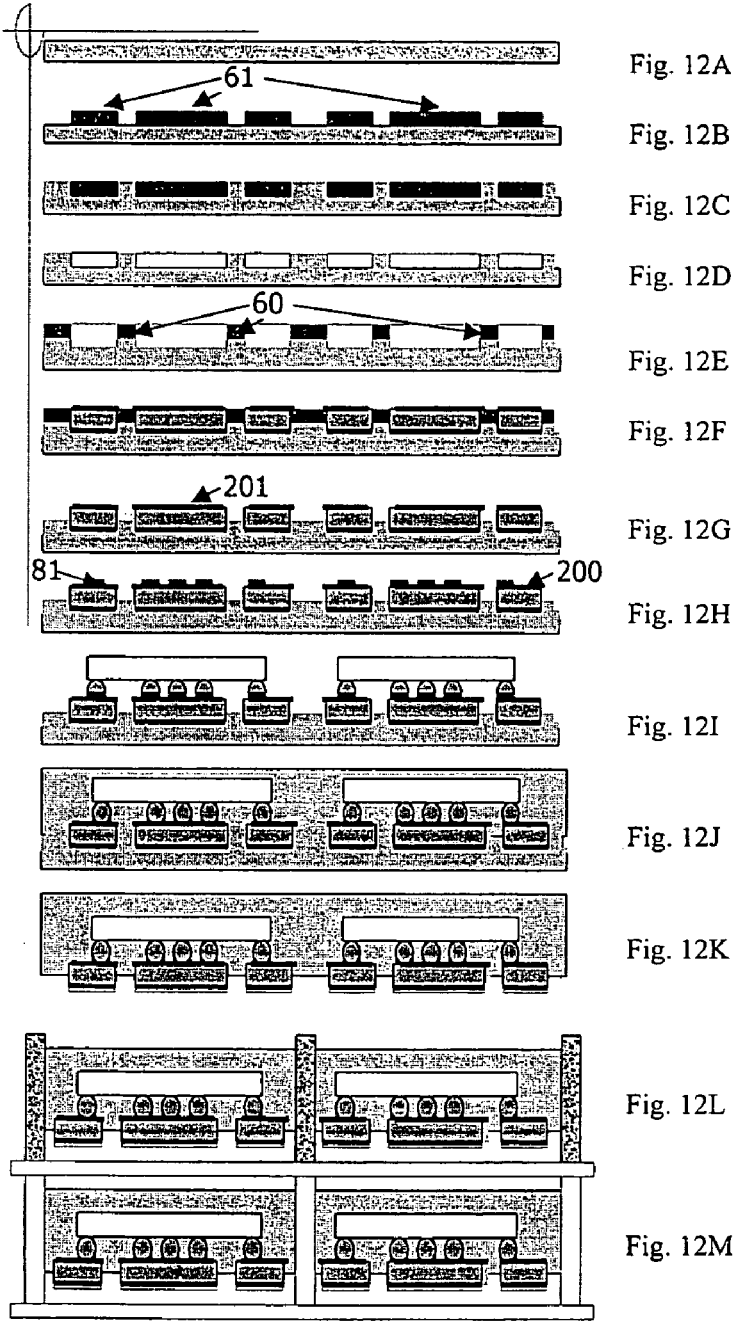

Figure 13 : "Mushroom" Locking Build Up

SEMICONDUCTOR PACKAGE

FIELD OF THE INVENTION

The present invention relates to a method for manufacturing a semiconductor package that is typically a quad flat no-lead (QFN) packaging having matrix array packaging (MAP). The invention also relates to a semiconductor package manufactured by this method.

BACKGROUND OF THE INVENTION

MAP type QFN semiconductor packages consist of multiple units arranged in an array format. Multiple units are manufactured on one substrate bar and are then divided into single units by sawing through the bar. The bar has the function of facilitating the process of bonding the wires from the die to the package terminals, which is more easily carried out if the package units are supported on a single substrate.

FIG. 1 illustrates the typical construction of QFN semiconductor package. The package comprises a semi conductor die 302 supported on a die attachment pad 201 and connected through wires 202 to interconnection pads 200. The whole assembly is encapsulated in an encapsulation material 300, typically a polymer. Such packages are then placed on motherboards to form part of an electronic circuit.

The process for producing a typical package is illustrated in FIGS. 2a) to 2g) and is carried out by first attaching an etched leadframe onto backing tape (FIG. 2a). FIG. 2b) illustrates that the semiconductor die is next attached onto the die attachment pads on the leadframe. Electric connection is then created between the semiconductor die and interconnection pads by bonding wirebonds, such as gold wirebonds, between the semiconductor die and interconnection pads. FIG. 2d) shows that the assembly is then encapsulated to form a package. The backing tape prevents mould bleed of the filler material.

After the encapsulation material has cured the backing tape is removed. This is illustrated in FIG. 2e). The panel is then mounted on a tape or chuck and sawn with a saw blade to divide the panel into discrete package units. The saw is required to cut through two materials, namely the leadframe material and the encapsulation material. FIG. 2g) illustrates the final product of semi conductor packages in single units.

Tie bars are also used to hold the units together in a single panel.

These known methods for manufacturing semiconductor packages have problems with limited design flexibility with respect to leadframe positioning and limitations on reducing the size of the package. Semiconductor packages made from this method are also often not sufficiently robust to withstand certain end uses.

A semiconductor package, and a method for making the same, is required that is more flexible in design with respect to the location of the contact pads and die attachment pads and also in terms of the size and weight of the package.

SUMMARY OF THE INVENTION

One aspect of the present invention provides A method of making an electronic package characterised by:

forming a metal base on which to build the components of an electronic package;

applying a mask layer on the base to an area that is not to be occupied by interconnection pads or die attachment pads of the package;

plating layers of metal on the un-masked areas of the base to form the interconnection and die attachment pads;

removing the mask layer;

mounting a semiconductor die to at least one die attachment pad;

electrically connecting the semiconductor die to one or more interconnection pads;

embedding the components on the base in an encapsulation material to form a package;

removing the metal base to leave a package panel; and cutting the panel into discrete package units.

Another aspect of the invention provides the method claimed in claim 17 characterised by forming the enlarged head by plating the layers of metal forming the interconnection and die attachment pads over and above the top of the mask layer such that the head flares over the mask layer.

BRIEF DESCRIPTION OF THE DRAWINGS

The present invention is described further by way of example with reference to the accompanying drawings of which:

FIG. 1 illustrates a prior art QFN semiconductor package in cross section;

FIGS. 2a) to 2g) illustrate the steps in manufacturing the QFN semiconductor package;

FIG. 3a) is a schematic sectional plan view of a semiconductor package according to the present invention;

FIG. 3b) is a side sectional view of the package of FIG. 3a);

FIG. 3c) schematically illustrates in plan an alternate embodiment of the present invention;

FIG. 4 illustrates eight options of plating leadframe material;

FIG. 5 schematically illustrates a side section view a package according to the present invention;

FIG. 6 illustrates a further embodiment of the package of FIG. 5;

FIG. 7a) illustrates the semiconductor package with wire bonding;

FIG. 7b) illustrates the semiconductor package with flip chip bonding;

FIGS. 8a) to 8e) illustrate a raised embodiment of the semiconductor package;

FIGS. 9a) to 9j) illustrate the steps in producing one embodiment of the semiconductor package;

FIGS. 10a) to 10m) illustrate the steps in producing another embodiment of the semiconductor package;

FIGS. 11a) to 11j) illustrate the steps in producing yet another embodiment of the semiconductor package;

FIGS. 12a) to 12m) illustrate the steps in producing yet another embodiment of the semiconductor package.

DETAILED DESCRIPTION OF PREFERRED EMBODIMENTS

Figures 13A, 13B, 13C, 13D, 13E, 13F:
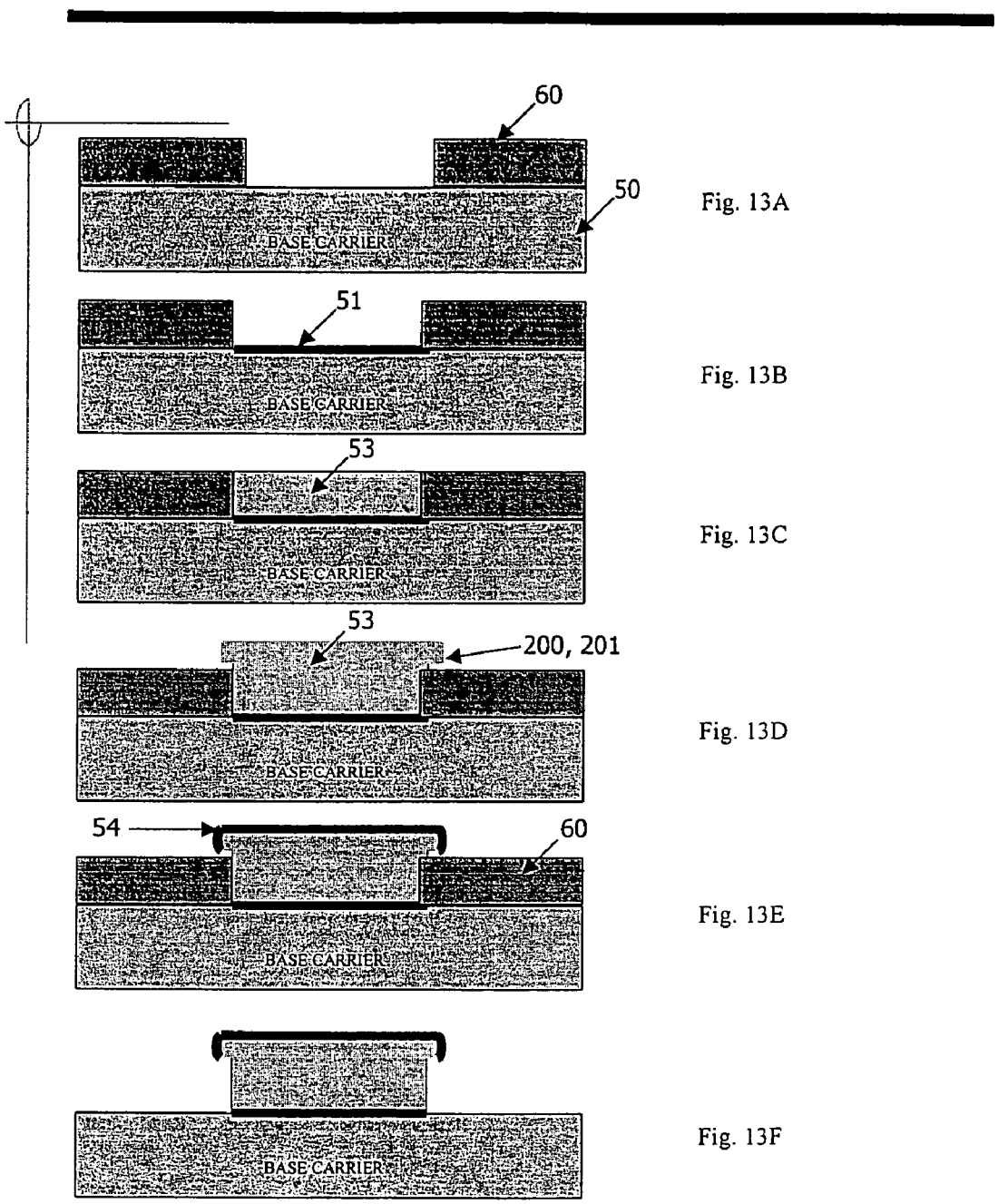
FIGS. 13a) to 13f) illustrate the steps in producing a component of the semiconductor package.

One embodiment of an electronic package 10 is illustrated in FIGS. 3a) and 3b). The electronic package is based on a quad flat no-lead type package where the leadframe is formed using a plated mask to create interconnection pads 200 and die attachment pads 201 without stamping or etching.

The result is an ultra thin small leadless package that can have a minimum of one die attachment pad and one interconnection pad. By plating a base substrate layer with a mask the pads can be positioned in any desirable configuration (not limited by stamping and etching tools) and can be placed closer together to form smaller packages.

The interconnection pads may be arranged uniformly around a die attachment pad in a single row or in multiple rows (staggered) as illustrated in FIG. 3c). The interconnection pads are separated by an equal pitch and are electrically connected to the semiconductor die in the package through wirebonds.

The semiconductor package is formed by plating several metal layers onto a base carrier layer 50 by way of electrolysis and defining the location of the metal layers by using a mask layer.

FIG. 9 illustrates the method for forming the semiconductor package. The semiconductor of this embodiment uses wirebond connections.

A flat and elongate metal base 50 is pre-etched to the required dimension depending on the dimensions allowed by the handling equipment. Base 50 forms the base on which the semiconductor package is built (FIG. 9a). A photo resistant and heat resistant, mask layer 60 is coated at specified locations on base 50 so as to leave exposed only the area to be plated in forming the interconnection and die attachment pads.

FIG. 9c) illustrates a number of metal layers plated on the metal base 50. The metal layers form the interconnection pads 200 and die attachment pads 201 of the package. These layers correspond to any one of the optional plating constructions illustrated in FIG. 4 discussed in greater detail below.

As shown in FIG. 9d) mask layer 60 is then stripped away from base 50 to leave the plated segments that will form the interconnection pads 200 and die attachment pads 201.

A semiconductor die 302 is attached on top of each die attachment pad 201 by means of adhesive or other standard techniques. This is illustrated in FIG. 9e). FIG. 9f) illustrates that wirebonds 202 are next connected between semiconductor die 302 and interconnection pads 200 to form an electrical connection therebetween (FIG. 9f).

The entire construction is then encapsulated with an encapsulation material 300, which is typically a polymer to form the package. FIG. 9g) illustrates encapsulation material 300 covering and filling the spaces inbetween pads 200, 201, semiconductor dies 302 and wirebonds 202. A rectangular package is formed.

Metal base 50 is then etched or removed in an appropriate manner to expose the undersurface of the interconnection pads 200 and die attachment pads 201 embedded in the encapsulation material 300 (FIG. 9h). The panel construction remaining is then mounted on a tape or chuck then divided by sawing with a saw 65 as illustrated in FIG. 9i) into individual units to form discrete electronic packages 10 illustrated in FIGS. 9j).

Several alternatives in the configuration of metal layers of the pads are shown in the eight options of FIG. 4. These options illustrate the different materials that may be used to build-up interconnection and die attachment pads in a package. These options illustrate preferred pad material constructions and are not intended to exclude other material selections and combinations that may also be suitable.

The base 50 supports formation of the interconnection pads 200 and die attachment pads 201. It is from this layer that the rest of the package is built upon. After building the pads the base is removed by etching so as to expose the undersides of the interconnection pads 200 and die attachment pads 201. The base layer is therefore made of a metal that is able to be easily etched off. Copper is a suitable material in this respect and is also readily available.

As illustrated in FIG. 4, a solderable metal layer 51 is the first layer to be plated on base 50. This is the layer of the package that will be exposed after the base is etched away. The solderable layer 51 must be of a stable metal with solderable characteristics to allow the package to be soldered to substrates. Accordingly, gold is the preferred solderable metal. A layer of gold or gold strike is illustrated plated on base 50 in all options of FIG. 4.

The pad layer 53 is the next layer of material that is used to build up the major portion of the interconnection pads and die attachment pads. Nickel or copper are preferred materials for forming the pad layer.

The interconnection layer 54 is plated at the last stage of the plating process and provides a finishing layer suitable for electrical interconnection. Gold or silver are both suitable materials to use for the interconnection layer.

The softer metal layers are prone to diffusion at higher temperatures. Therefore a barrier metal layer 52 is sometimes required to prevent two layers of metal diffusing. An example of a good barrier metal is palladium or nickel palladium. Generally this layer is plated onto the gold layer and inbetween the other layers. This also has the benefit of reducing the required thickness of the gold layer.

FIGS. 8a) to 8e) illustrate a modification to the above method for making semiconductor packages. The modification illustrated in these Figures is to the interconnection and die attachment pads 200 and 201 which in this embodiment protrude further from the underside of the package 10 than the standard package described above. Compare FIG. 8a) which illustrates a standard electronic package according to the present invention and FIG. 8b) illustrating a modified standoff, or raised package.

The raised package illustrated in FIGS. 8b) to 8e) has the benefit of allowing the semiconductor package 10 to be mounted on a substrate, or board 70, in a raised position. This provides for easier attachment of the package to the board and reliable leveling therebetween. The pitch space between the interconnection pads may be reduced and finely adjusted. Extra solder filler may be inserted between the pads to strengthen the bond between the package and the board.

FIGS. 10a) to 10m) illustrate the steps in manufacturing the raised package version. The process begins with forming base layer 50 but instead of plating mask layer 60 in the areas not to be formed into pads 200 or 201, first mask layer 61 is plated over the areas on which interconnection and die attachment pads will be formed. Accordingly, the non-pad areas inbetween can be built up as illustrated in FIG. 10c) by plating a layer of the same metal as is used to make the base 50 (normally copper). This raises the effective thickness of the base at filled pockets 67 inbetween the masked areas. The reasoning for this is that the pockets 67 will be etched or scraped away along with base 50 near the end of the process. Once pockets 67 are filled with base material, the mask layer 61 is removed as shown in FIG. 10d).

Up to now the steps in the process have been directed to creating a deeper cavity 68 in which to form a thicker interconnection pad or die attachment pad layer. A second masking layer 60 is then reapplied on top of the filled pockets 67 (FIG. 10e).

Interconnection pads 200 and die attachment pads 201 are then formed by filling the cavity 68 with the appropriate material, which can be selected from, but not restricted to, one of the options in FIG. 4. This step is illustrated in FIG. 10f). The pad layer is brought to substantially the same height as the mask layer 60.

FIG. 10g) illustrates the masks 60 stripped from the construction. A semiconductor die 302 is next attached onto each die attachment pad 201 of each unit carried by the metal base 50 (FIG. 10h). The wirebonding and encapsulation steps are carried out in a similar manner to that described in FIG. 9.

The base 50 and filler material 67 inbetween the pads 200, 201 is then removed by etching or stripping away so as to leave pads 200, 201 protruding from the underside of the package 10.

As with the previous embodiment the panel is then mounted onto a tape or chuck and sawn into discrete units.

FIGS. 7a) illustrates in cross section the electronic package with wire bonding. In place of wire bonding the package may be constructed using flip chip bonding technologies as illustrated in FIG. 7b). The flip chip version uses flip chip solder balls 203 rather than wirebonds 202. The semiconductor die 302 spans across the interconnection and die attachment pads 200, 201 with electrical connections formed by the solder balls between the die and the pads. In an alternate embodiment the solder balls may be replaced by metal deposited at the wafer lever (that is above the pad level) in the form of pillar bumps, collar bumps, stud bumps or any other suitable form.

FIGS. 11a) to 11j) illustrate the process for producing the semiconductor package using flip chip interconnections. FIGS. 11a) to 11d) illustrate the same process steps as the wirebond version illustrated in FIG. 9a) to 9d).

FIG. 11e) illustrates flux or solder 81 deposited or printed on the die attachment pads 201 and interconnection pads 200. This forms the attachment points for the flip chip bumps 80. A semiconductor die 302 having pre-attached flip chip bumps 203 is then flipped so that the bumps are on the underside of the die and attached to the die attachment pads 201 and interconnection pads 200 by way of the flux or solder on these pads (see FIG. 11f). The entire construction is then passed through a reflow oven to cure the soldered joints which electrically connect the semiconductor die 302 to the pads 200, 201.

FIG. 11g) shows encapsulation of the construction with encapsulation material 300. In the remaining steps base 50 is removed and the panel divided into discrete units in steps corresponding to FIGS. 9g) to 9j).

FIGS. 12a) to 12m) illustrate the steps involved in constructing the electronic package using flip chip interconnection and incorporating protruding pads 200, 201 to produce a raised package. In this process the solder points 81 are applied to the interconnection and die attachment pads 200, 201 after the masks 60 have been removed from between pads 200, 201. The remaining steps are a combination of steps illustrated in FIGS. 10 and 11.

FIG. 6 illustrates an embodiment of the semiconductor package 10 which provides a solder finish 204 on the underside of the interconnection or die attachment pads. This allows the package to be directly mounted onto a substrate, such as a motherboard, without having to first deposit or print solder onto the motherboard.

To obtain this solder finish, the package 10 as illustrated in FIG. 5 is taken through a solder dipping process to coat the exposed interconnection pads 200 and die attachment pads 201 with solder. While still attached as a single panel and before being sawn into individual units, the array or packages are held by a dipping jig, dipped into molten solder then removed and cooled. Aside from providing a stable support, the dipping jig also acts as a heat sink to reduce the heat flow from the moltend solder into the package.

FIG. 5 illustrates how the shape of a die attachment pad or an interconnection pad can be formed into a "mushroom" shape which, it has been found, improves the hold of the encapsulation material 300 on the die attachment and interconnection pads 201, 200. The enlarged area of FIG. 5 illustrates in perspective view a single pad having a flared top which, in a stylised manner, resembles a mushroom and hence draws the mushroom reference.

FIG. 5 also illustrates the semiconductor package 10 with the interconnection and die attachment pads embedded in the encapsulation material 300. With the mushroom feature, the pads are less inclined to detach or become dislodged from the encapsulation material.

FIGS. 13a) to 13f) illustrate the steps in producing the "mushroom"-shaped interconnection or die attachment pads. FIG. 13a) begins at the step with base 50 and mask layer 60 already established. FIG. 13b) shows the first layer of the pads plated onto the base 50. This is the solderable, usually gold, layer. In FIG. 13c) the pad layer of material is plated on top of the solderable layer to build up the thickness of the pad up and above the height of mask layer 60 so that the material overflows and expands slightly over and onto the mask layer 60 to create a flared mushroom shape. A final interconnection, or bondable, metal layer is plated across the top of the "mushroom" shaped pad 200, 201 by electrolysis.

The described pad construction is the basic construction illustrated in option 1 of FIG. 4. However, other suitable construction shown in FIG. 4 or otherwise may also be used.

The mask layer 60 is then stripped away leaving islands of interconnection pads and die attachment pads having a larger "mushroom" head which assists in locking the pads when embedded in the encapsulating material.

The present semiconductor package is a leadless package developed from a QFN platform. It can be made a very thin and very small restricted only by mask layer dimensions and associated handling equipment. This offers advantages in applications where small size, thickness and weight is desired. The package and method of making the package also allows flexibility in design with respect to leads and contact pads to allow customisation of the package. The pattern of mask layer 60 can easily be changed to suit the purpose. The present package and method remove the dependence of forming the package on a connecting panel bar and using entire bars to hold the units in place until they are divided. Furthermore, base 50 used in manufacturing the package effectively prevents mould bleed during manufacturing.

It is to be understood that, if any prior art publication is referred to herein, such reference does not constitute an admission that the publication forms a part of the common general knowledge in the art, in Malaysia or any other country.

It will be understood to persons skilled in the art of the invention that many modifications may be made without departing from the scope of the invention.

The invention claimed is:

1. A method of making an electronic package, said method comprising the steps of:
   forming a metal base on which to build the components of an electronic package;
   applying a mask layer on the base to an area that is not to be occupied by interconnection pads or die attachment pads of the package;
   plating layers of metal on the un-masked areas of the base to form the interconnection and die attachment pads;
   removing the mask layer;
   mounting a semiconductor die to at least one die attachment pad;
   electrically connecting the semiconductor die to one or more interconnection pads;
   embedding the components on the base in an encapsulation material to form a package;

removing the metal base to leave a package panel;
cutting the panel into discrete package units; and
applying a mask layer that is photo resistant and/or heat resistant.

2. A method of making an electronic package, said method comprising the steps of:
forming a metal base on which to build the components of an electronic package;
applying a mask layer on the base to an area that is not to be occupied by interconnection pads or die attachment pads of the package;
plating layers of metal on the un-masked areas of the base to form the interconnection and die attachment pads;
removing the mask layer;
mounting a semiconductor die to at least one die attachment pad;
electrically connecting the semiconductor die to one or more interconnection pads;
embedding the components on the base in an encapsulation material to form a package;
removing the metal base to leave a package panel;
cutting the panel into discrete package units; and
forming the interconnection and die attachment pads by first plating a solderable layer on the base, followed by plating a pad layer on the solderable layer and plating an interconnection layer on the pad layer.

3. The method of claim 2, further comprising plating a barrier layer between the solderable layer and pad layer and/or between the pad layer and interconnection layer.

4. The method claimed in claim 2, further comprising combining two or more metals to form a layer.

5. The method claimed in claim 2, further comprising using copper as the material for the base.

6. The method claimed in claim 2, further comprising using gold or gold strike as the material for the solderable layer.

7. The method claimed in claim 2, further comprising using nickel or copper for the material for the pad layer.

8. The method claimed in claim 2, further comprising using gold or silver as the material for the interconnection layer.

9. The method claimed in claim 2, further comprising using palladium or nickel palladium as the material for the barrier layer.

10. A method of making an electronic package, said method comprising the steps of:
forming a metal base on which to build the components of an electronic package;
applying a mask layer on the base to an area that is not to be occupied by interconnection pads or die attachment pads of the package;
plating layers of metal on the un-masked areas of the base to form the interconnection and die attachment pads;
removing the mask layer;
mounting a semiconductor die to at least one die attachment pad;
electrically connecting the semiconductor die to one or more interconnection pads;
embedding the components on the base in an encapsulation material to form a package;
removing the metal base to leave a package panel;
cutting the panel into discrete package units;
electrically connecting the semi conductor die to one or more interconnection pads using flip chip bumps pre-attached to the semiconductor die;
after removing the mask layer, depositing flux or solder on at least one interconnection pad and at least one die attachment pad; and
mounting a flip chip semiconductor die onto the flux or solder to form an electrical connection between the semiconductor die and at least one interconnection pad.

11. A method of making an electronic package, said method comprising the steps of;
forming a metal base on which to build the components of an electronic package;
applying a mask layer on the base to an area that is not to be occupied by interconnection pads or die attachment pads of the package;
plating layers of metal on the un-masked areas of the base to form the interconnection and die attachment pads;
removing the mask layer;
mounting a semiconductor die to at least one die attachment pad;
electrically connecting the semiconductor die to one or more interconnection pads;
embedding the components on the base in an encapsulation material to form a package;
removing the metal base to leave a package panel;
cutting the panel into discrete package units;
forming interconnection and die attachment pads protruding from the underside of the package by carrying out the following steps inbetween the steps of forming a metal base and applying a mask layer;
applying an additional mask layer on the base to the areas that are to be occupied by the interconnection and die attachment pads of the package;
plating the remaining exposed areas of the base with the metal base material to increase the thickness of the base inbetween where the interconnection and die attachment pads are to be formed; and
removing the additional mask layer.

12. A method of making an electronic package, said method comprising the steps of:
forming a metal base on which to build the components of an electronic package;
applying a mask layer on the base to an area that is not to be occupied by interconnection pads or die attachment pads of the package;
plating layers of metal on the un-masked areas of the base to form the interconnection and die attachment pads;
removing the mask layer;
mounting a semiconductor die to at least one die attachment pad;
electrically connecting the semiconductor die to one or more interconnection pads;
embedding the components on the base in an encapsulation material to form a package;
removing the metal base to leave a package panel;
cutting the panel into discrete package units;
applying a solder finish to the exposed interconnection and die attachment pads on the underside of the package after removal of the base; and
mounting the package panel in a dipping jig and dipping the underside of the package into molten solder before cutting the panel into discrete package units.

* * * * *